United States Patent
Koo (10) Patent No.: US 10,068,746 B2
(45) Date of Patent: Sep. 4, 2018

(54) SCANNING ELECTRON MICROSCOPE

(71) Applicant: Seron Technologies Inc., Uiwang-si, Gyeonggi-do (KR)

(72) Inventor: Jeonghoi Koo, Yongin-si (KR)

(73) Assignee: Seron Technologies Inc., Uiwang-si (KR)

( * ) Notice: Subject to any disclaimer, the term of this patent is extended or adjusted under 35 U.S.C. 154(b) by 0 days.

(21) Appl. No.: 15/380,366

(22) Filed: Dec. 15, 2016

(65) Prior Publication Data

US 2017/0169990 A1  Jun. 15, 2017

(30) Foreign Application Priority Data

Dec. 15, 2015  (KR) .................. 10-2015-0179085

(51) Int. Cl.
*H01J 37/09* (2006.01)
*H01J 37/16* (2006.01)
(Continued)

(52) U.S. Cl.
CPC ............ *H01J 37/244* (2013.01); *H01J 37/06* (2013.01); *H01J 37/20* (2013.01); *H01J 37/28* (2013.01);
(Continued)

(58) Field of Classification Search
CPC .. H01J 37/09; H01J 37/16; H01J 37/18; H01J 37/244; H01J 37/147; H01J 37/20;
(Continued)

(56) References Cited

U.S. PATENT DOCUMENTS 4,714,833 A * 12/1987 Rose .................... H01J 37/153
                                                     250/310
7,425,701 B2 * 9/2008 Steigerwald .......... H01J 37/244
                                                     250/306
(Continued)

FOREIGN PATENT DOCUMENTS

KR  20-1993-0003508 B1  2/1993
KR     10-1321049 B1   10/2013
(Continued)

OTHER PUBLICATIONS

Korean Office Action dated Nov. 29, 2016 in connection with the counterpart Korean Patent Application No. 10-2015-0179085, citing the above reference(s).
(Continued)

*Primary Examiner* — David A Vanore
(74) *Attorney, Agent, or Firm* — Hauptman Ham, LLP (57) ABSTRACT

The present invention relates to a scanning electron microscope realized to observe a test sample by detecting back-scattered electrons scattered and emitted from a surface of the test sample in the air without a vacuum chamber which is allowed to observe the test sample in a vacuum state the scanning electron microscope can be useful in minimizing dispersion of electrons of the electron beam passing through the shielding film caused due to electron scattering by focusing the electron beam passing through the shielding film on a top surface of the first back-scattered electron detector disposed between the electron gun and the shielding film to pass an electron beam and configured to detect back-scattered electrons scattered from the test sample since the first back-scattered electron detector is provided with the first planar coil having a magnetic field formed thereon.

11 Claims, 7 Drawing Sheets

(51) Int. Cl.
*H01J 37/244* (2006.01)
*H01J 37/06* (2006.01)
*H01J 37/20* (2006.01)
*H01J 37/28* (2006.01)

(52) U.S. Cl.
CPC ............... *H01J 2237/026* (2013.01); *H01J 2237/24475* (2013.01)

(58) Field of Classification Search
CPC .......... H01J 2237/10; H01J 2237/2448; H01J 2237/0451; H01J 2237/043; H01J 2237/083; H01J 2237/188; G01N 23/225; G01N 23/2251
USPC .................. 250/307, 310, 306, 311, 396 ML
See application file for complete search history.

(56) References Cited

U.S. PATENT DOCUMENTS

| | | | | |
|---|---|---|---|---|
| 8,097,848 B2* | 1/2012 | Hatano | ................. | H01J 37/244 250/310 |
| 8,653,457 B2* | 2/2014 | Stoks | ................... | G01N 23/225 250/306 |
| 9,741,525 B1* | 8/2017 | Sed'a | ................... | H01J 37/153 |
| 2006/0076492 A1* | 4/2006 | Taniguchi | ............. | H01J 37/224 250/311 |
| 2006/0249674 A1* | 11/2006 | Slowko | ................. | H01J 37/244 250/305 |
| 2008/0185509 A1* | 8/2008 | Knowles | ............... | H01J 37/228 250/251 |
| 2009/0272899 A1* | 11/2009 | Yamazaki | ............... | H01J 37/28 250/307 |
| 2011/0049344 A1* | 3/2011 | Dobashi | ................ | H01J 37/222 250/252.1 |
| 2014/0353499 A1* | 12/2014 | Terada | .................... | H01J 37/26 250/307 |
| 2015/0014530 A1* | 1/2015 | Ominami | ................ | H01J 37/16 250/311 |
| 2015/0041648 A1* | 2/2015 | Shirahata | .............. | H01J 37/222 250/307 |
| 2015/0129763 A1* | 5/2015 | Ominami | ................ | H01J 37/16 250/310 |
| 2015/0144808 A1* | 5/2015 | Ribton | .................... | H01J 27/18 250/493.1 |
| 2015/0228449 A1* | 8/2015 | Kawanishi | .............. | H01J 37/16 250/307 |
| 2017/0309443 A1* | 10/2017 | Han | ........................ | H01J 37/10 |

FOREIGN PATENT DOCUMENTS

KR 10-1348581 B1 1/2014
KR 0-2014-0119078 A 10/2014

OTHER PUBLICATIONS

Korean Notice of Allowance dated Apr. 3, 2017 in connection with the counterpart Korean Patent Application No. 10-2015-0179085, citing the above reference(s).

* cited by examiner

SCANNING ELECTRON MICROSCOPE

CROSS-REFERENCE TO RELATED APPLICATION

This application claims priority to and the benefit of Korean Patent Application No. 10-2015-0179085 filed in the Korean Intellectual Property Office on Dec. 15, 2015 respectively, the entire contents of which are incorporated herein by reference.

BACKGROUND

1. Field of the Invention

The present invention relates to a scanning electron microscope, and more particularly, to a scanning electron microscope realized to observe a test sample by detecting back-scattered electrons scattered and emitted from a surface of the test sample in the air without a vacuum chamber which is allowed to observe the test sample in a vacuum state.

2. Discussion of Related Art

In recent years, the packing density of semiconductors and display and part materials has drastically increased with the development of IT/NT technology. There has been an increasing demand for analyses using an electron microscope capable of analyzing such IT/NT technology, and a representative example is a scanning electron microscope (hereinafter referred to as 'SEM').

The SEM is observation equipment using a principle of observing a test sample by focusing an electron beam shot from an electron gun through electromagnetic lenses, shooting the focused electron beam to a predetermined micro-area of a surface of the test sample mounted on a test sample stage of a vacuum chamber to collect secondary electrons emitted from the surface of the test sample and filling the scanned area with monitor pixels. Here, the SEM is an image analysis device used to observe a surface of the test sample (several ten nanometers (nm)).

Meanwhile, when the electron beam shot from an electron gun of the SEM and focused in the form of high energy is incident on a surface of the test sample, primary electrons incident on the test sample escape to a ground wire. In this case, a situation in which the primary electrons accumulate in the test sample without escaping to the ground wire is referred to as a charge-up phenomenon, and often occurs on non-conductor test samples such as organic matters, biological samples, etc.

Such primary electrons form hole pairs inside the test sample, and thus a surface of the test sample is negatively charged. When the surface of the test sample is negatively charged, a yield of the secondary electrons emitted from the surface of the test sample may significantly increase, whereas images may become too bright or get wiggly due to high mutual repulsion between incident electrons and secondary electrons, which makes it difficult to obtain normal high-quality clear images.

Therefore, to minimize such a phenomenon, a conventionally applied method is used to coat a conductive material such as Au or carbon on a surface of a test sample to a thickness of several ten nanometers. That is, this is a method of treating a test sample by applying a potential difference between a cathode target (Au, Pt or carbon) and a test sample bar (an anode) under a plasma atmosphere and emitting an electron beam, with which a surface of the test sample coated using a coating machine used to thinly apply ions onto a surface of the test sample is irradiated, along a test sample holder and a stage connected to the ground.

However, such a method of coating a test sample has a problem in that a liquid material of a liquid test sample such as a gel is not easily coated when the liquid test sample is applied. Also, a method of coating a liquid test sample after drying the liquid test sample also has a problem in that it is very difficult to observe contents covered with the gel and liquid test sample due to the characteristics of apparatuses such as a scanning electron microscope used to observe a surface of the test sample (several ten nanometers (nm)). Further, when test samples having a size of several tens to hundred nanometers are to be observed, the coating thickness has a significant influence on measurement errors. Accordingly, there is a need for overcoming the challenges of such technology.

To solve the above problems, a scanning electron microscope (hereinafter referred to as 'air SEM') capable of observing test samples in the air has been developed. Such an air SEM has an advantage in that, since there is an organic test sample in the air, the test sample can be observed without any additional pre-treatment since a charge-up effect becomes very poor as electrons accumulated on a surface of the test sample are neutralized with cations ionized from particles in the air when the surface of the test sample is irradiated with an electron beam.

However, the air SEM has a problem in that an electron beam may be dispersed in the air during a process of focusing the electron beam on a surface of the test sample left in the air. Therefore, to minimize a distance at which the electron beam is exposed to the air, the air SEM has a physical limitation in that a distance between the test sample and a shielding film, which is shot with an electron beam out of a vacuum state, is close to 50 to 200 μm to observe the test sample.

Accordingly, the air SEM has a problem in that it is primarily focused so that a surface of the test sample does not come in contact with the shielding film, and a slidable test sample stage is located while maintaining a constant height.

PRIOR-ART DOCUMENT

Patent Document

Korean Patent No. 10-1348581 (Dec. 31, 2013)

SUMMARY OF THE INVENTION

The present invention is directed to providing a scanning electron microscope capable of securing a distance between a shielding film and a test sample while minimizing dispersion of electrons of an electron beam passing through the shielding film caused due to electron scattering.

One aspect of the present invention provides a scanning electron microscope which includes a column in which a vacuum state is formed, an electron gun disposed above the column and configured to shoot an electron beam in a downward direction under a vacuum, a shielding film forming a portion of a bottom surface of the column so that an inner part of the column is formed in a vacuum state and configured to pass the electron beam therethrough, a test sample stage disposed under the shielding film to dispose a test sample so that the test sample is irradiated with the electron beam passing through the shielding film from the electron gun, and a first back-scattered electron detector disposed between the electron gun and the shielding film to form a hole through which the electron beam passes, provided with a first planar coil having a magnetic field formed on a top surface thereof so as to focus the electron beam and transfer the focused electron beam to the shielding film, and configured to detect back-scattered electrons scattered backward from the test sample.

In the scanning electron microscope according to the present invention, the first back-scattered electron detector may include a first wafer having a top surface having the first planar coil formed thereon and disposed between the electron gun and the shielding film to form the hole through which the electron beam passes, and a photodiode formed on a bottom surface of the first wafer to detect the back-scattered electrons.

In the scanning electron microscope according to the present invention, the first planar coil may have a coil pattern formed around the hole on the top surface of the first wafer.

In the scanning electron microscope according to the present invention, the first planar coil may be formed by mounting a separate coil pattern on the top surface of the first wafer around the hole.

In the scanning electron microscope according to the present invention, the shielding film may include a cover plate forming a portion of the bottom surface of the column, and an ultra-thin film formed on the cover plate to form an inner part of the column in a vacuum state, wherein the electron beam passes through the ultra-thin film.

In the scanning electron microscope according to the present invention, the ultra-thin film may include a silicon thin film formed by etching the cover plate.

In the scanning electron microscope according to the present invention, the cover plate may have a hole formed therein to pass the electron beam therethrough, and the ultra-thin film may include a graphene thin film attached to a bottom surface of the cover plate so that the graphene thin film includes the hole.

In the scanning electron microscope according to the present invention, the shielding film may further include a second planar coil provided on a top surface of the cover plate and configured to form a magnetic field to secondarily focus the electron beam primarily focused through the first planar coil and transfer the secondarily focused electron beam to the test sample.

In the scanning electron microscope according to the present invention, the magnetic fields of the first and second planar coils may be formed in the same direction as that of the electron beam, or may be formed in an opposite direction to that of the electron beam.

The scanning electron microscope according to the present invention may further include a second back-scattered electron detector disposed above the column and configured to detect back-scattered electrons flowing inside the column through the hole of the first back-scattered electron detector.

The scanning electron microscope according to the present invention may further include a chamber formed to surround the test sample stage and coupled to the column, a gas supply unit formed at one side of the chamber to supply an inert gas between the ultra-thin film and the test sample stage, and an X-ray spectrometer provided in the vicinity of the test sample stage on which the test sample of the chamber is disposed to detect X rays emitted from the test sample.

Another aspect of the present invention provides a scanning electron microscope which includes a column in which a vacuum state is formed, an electron gun disposed above the column and configured to shoot an electron beam in a downward direction under a vacuum, a shielding film forming a portion of a bottom surface of the column so that an inner part of the column is formed in a vacuum state and provided with a second planar coil having a magnetic field formed on a top surface thereof so as to focus the electron beam and pass the focused electron beam therethrough, a test sample stage disposed under the shielding film to dispose a test sample so that the test sample is irradiated with the electron beam passing through the shielding film from the electron gun, and a first back-scattered electron detector disposed between the electron gun and the shielding film to form a hole through which the electron beam passes and configured to detect back-scattered electrons scattered backward from the test sample.

According to the present invention, the scanning electron microscope can be useful in minimizing dispersion of electrons of an electron beam passing through a shielding film caused due to electron scattering by focusing an electron beam passing through the shielding film on a top surface of a first back-scattered electron detector disposed between an electron gun and the shielding film to pass an electron beam and configured to detect back-scattered electrons scattered from a test sample since the first back-scattered electron detector is provided with a first planar coil having a magnetic field formed thereon.

Also, the scanning electron microscope according to the present invention can be useful in minimizing dispersion of electrons of an electron beam caused due to electron scattering by focusing an electron beam shot onto a test sample through an ultra-thin film since a second planar coil having a magnetic field formed thereon is provided on a top surface of a shielding film.

Further, the scanning electron microscope according to the present invention can be useful in minimizing dispersion of electrons of an electron beam passing through a shielding film caused due to electron scattering by primarily focusing an electron beam passing through the shielding film on a top surface of a first back-scattered electron detector disposed between an electron gun and the shielding film to pass an electron beam and configured to detect back-scattered electrons scattered from a test sample since the first back-scattered electron detector is provided with a first planar coil having a magnetic field formed thereon, and secondarily focusing the electron beam through a second planar coil formed on a top surface of the shielding film.

Accordingly, as the dispersion of the electron beam passing thorough the shielding film is minimized, the scanning electron microscope according to the present invention can be useful in reducing unnecessary processes, for example, securing a distance between the shielding film and the test sample to adjust an initial focus with a separate optical microscope, loading the test sample, etc.

DETAILED DESCRIPTION

In the following description, detailed descriptions of well-known functions or constructions will be omitted since they would obscure the invention in unnecessary detail.

It should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Hereinafter, exemplary embodiments of the present invention will be described in detail.

Figure 1:
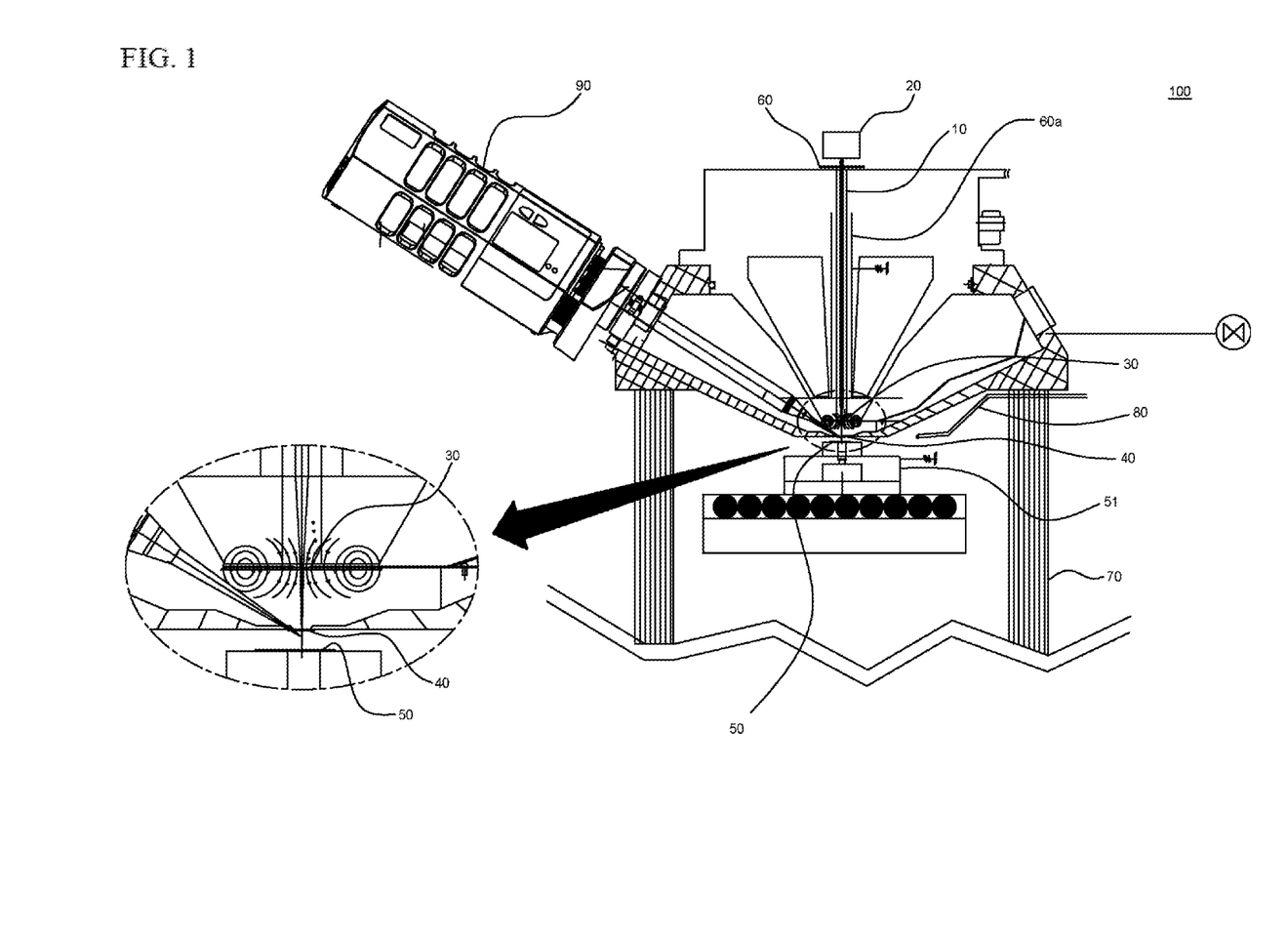
FIG. 1 is a schematic diagram illustrating a scanning electron microscope according to a first exemplary embodiment of the present invention.

FIG. 1 is a schematic diagram illustrating a scanning electron microscope according to a first exemplary embodiment of the present invention.

Referring to FIG. 1, a scanning electron microscope 100 according to a first exemplary embodiment of the present invention includes a column 10, an electron gun 20, a first back-scattered electron detector 30, a shielding film 40, and a test sample stage 50. In addition, the scanning electron microscope 100 according to the first exemplary embodiment of the present invention includes a second back-scattered electron detector 60, a chamber 70, a gas supply unit 80, and an X-ray spectrometer 90.

The column 10 forms an inner space through which an electron beam may pass in the form of a tube according to the present invention. Here, the space formed inside the column 10 is maintained in a vacuum state.

Although not shown, such a column 10 may include an object lens configured to focus an electron beam shot from the electron gun 20, and a deflecting coil.

The electron gun 20 serves to generate and accelerate electrons. Such an electron gun 20 supplies a stable electron source used in the form of electron rays. That is, the electron gun 20 is formed above the column 10 to shoot an electron beam in a downward direction.

Here, since electrons in an atom has constant energy in a predetermined position due to the action of electric force with an atomic nucleus, a situation in which the electrons fall out of their positions at room temperature and are emitted into the air hardly arises. However, when energy greater than an energy barrier of the electrons is applied, the electrons are popped out.

Therefore, the electron gun 20 may be realized to heat a metal including tungsten so that electrons constrained in atoms of a surface of the metal fall out of the constraint of the atomic nucleus to break away toward the column.

Such an electron gun 20 may include a thermionic electron gun or a field emission electron gun.

The first back-scattered electron detector 30 is provided inside the column 10, and disposed between the electron gun 20 and the shielding film 40. Such a first back-scattered electron detector 30 may detect back-scattered electrons which are scattered from a surface of a test sample and again emitted out of the surface of the test sample.

Here, in the scanning electron microscope 100 according to the first exemplary embodiment of the present invention, a magnetic field may be formed to focus the electron beam shot from the electron gun 20 and pass the electron beam.

The shielding film 40 forms a portion of a bottom surface of the column 10 so that an inner part of the column 10 is formed in a vacuum state. That is, the shielding film 40 maintains a vacuum state of the column 10 while forming a portion of the bottom surface of the column 10 through an ultra-thin film provided in a path through which the electron beam passes. In this case, the electron beam shot from the electron gun 20 and transferred through the first back-scattered electron detector 30 may be allowed to pass through the shielding film 40.

A test sample is disposed on a top surface of the test sample stage 50 so that the test sample is accurately irradiated with the electron beam passing through the shielding film 40. Such a test sample stage 50 may be made of a metal material such as a stud, etc. In this case, the test sample stage 50 may be connected to the ground via a separate holder 51.

The second back-scattered electron detector 60 is disposed above the column 10, and may detect back-scattered electrons which are scattered from the test sample and flow through a hole of the first back-scattered electron detector 30.

To collect back-scattered electrons generated when the electron beam shot onto the test sample in the air collides with the test sample, the second back-scattered electron detector 60 is disposed above the column 10 to multiply a detection effect of the high-quality back-scattered electrons emitted due to direct collision with the test sample in addition to the back-scattered electrons primarily collected at the first back-scattered electron detector 30.

That is, in addition to the first back-scattered electron detector 30, the second back-scattered electron detector 60 may be used to realize a high-resolution image by applying a negative level of boosting voltage 60a to collect the back-scattered electrons flowing inside the column 10 along the hole of the first back-scattered electron detector 30 so as to maximize collection of the back-scattered electrons with excellent resolution.

The chamber 70 is in a non-vacuum state rather than a vacuum state, formed to surround the test sample, and coupled to the column 10. In this case, the chamber 70 and the column 10 may be detachably coupled to each other.

The gas supply unit 80 may serve to supply an inert gas into the chamber 70. Here, the inert gas may be one selected from helium (He), neon (Ne), and argon (Ar).

The X-ray spectrometer 90 may detect X rays emitted due to interaction between primary electrons and a solid test sample. The X-ray spectrometer 90 may detect the intensity of characteristic X rays generated by shooting an electron beam to the test sample and determine a distribution of elements, which is used for qualitative and quantitative analyses.

Hereinafter, the first back-scattered electron detector 30 according to the first exemplary embodiment of the present invention will be described in further detail with reference to the drawings.

Figure 2:
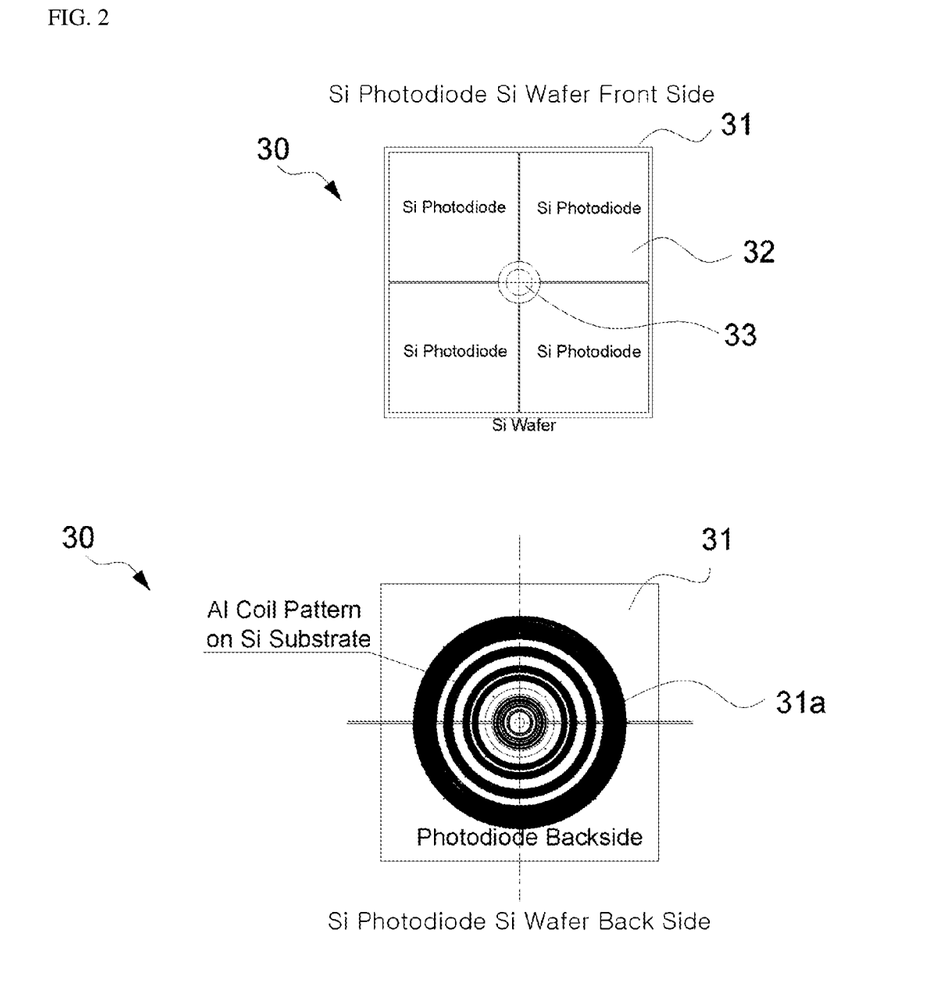
FIG. 2 is a diagram illustrating top and bottom surfaces of a first back-scattered electron detector in the scanning electron microscope according to the first exemplary embodiment of the present invention.
Figure 3:
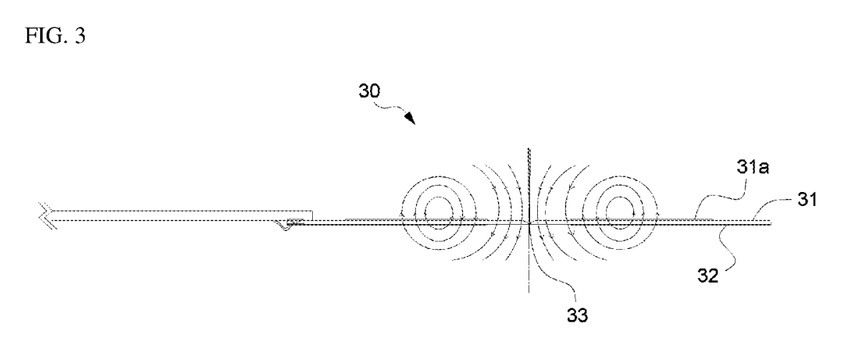
FIG. 3 is a cross-sectional view of the first back-scattered electron detector in the scanning electron microscope according to the first exemplary embodiment of the present invention.

FIG. 2 is a diagram illustrating top and bottom surfaces of a first back-scattered electron detector in the scanning electron microscope according to the first exemplary embodiment of the present invention, and FIG. 3 is a cross-sectional view of the first back-scattered electron detector in the scanning electron microscope according to the first exemplary embodiment of the present invention.

Referring to FIGS. 1 to 3, the first back-scattered electron detector 30 according to the first exemplary embodiment of the present invention includes a first wafer 31 and a photodiode 32.

The first wafer 31 is provided with a first planar coil 31a having an electric field formed on a top surface thereof, and may be disposed between the electron gun 20 and the shielding film 40 to form a hole 33 through which the electron beam passes. Here, the first wafer 31 may include a silicon material.

Here, an electric current is applied to the first planar coil 31a, and the first planar coil 31a to which the electric current is applied forms a magnetic field. In this case, the magnetic field formed from the first planar coil 31a may be formed in the same direction as a shooting direction of the electron beam.

Accordingly, the electron beam shot from the electron gun 20 may be focused by the magnetic field formed by the first planar coil 31a while passing through the hole 33 formed in the first wafer 31.

Also, the magnetic field formed from the first planar coil 31a may be formed in an opposite direction to the shooting direction of the electron beam.

In this case, a quantity of energy incident on the test sample may be minimized by interfering with a highly accelerated energy of electron beam shot from the electron gun 20, thereby minimizing damage of a surface of the test sample caused when a highly accelerated voltage of electron beam is applied to the surface of the test sample.

As such, the direction of the magnetic field may be determined according to a winding direction of the first planar coil 31a.

Such a first planar coil 31a may be formed in the form of a coil pattern around the hole 33 on a top surface of the first wafer 31. That is, the first planar coil 31a may generate a magnetic field to focus the electron beam by depositing a planar coil on the top surface of the first wafer 31 using a semiconductor pattern process and applying a minute electric current to the planar coil.

Also, the first planar coil 31a may generate a magnetic field to focus the electron beam by mounting an ultra-thin-film printed circuit board (PCB) having a separate coil pattern formed thereon onto the top surface of the first wafer 31 and applying a minute electric current to the PCB. That is, the first planar coil has a coil pattern formed around the hole by forming a hole on a central region of a separate PCB so that an electron beam passes through the hole, forming a coil pattern around the hole, and attaching the PCB, on which the coil pattern is formed, to the top surface of the first wafer.

A plurality of photodiodes 32 may be provided on a bottom surface of the first wafer 31, and a bias voltage may be controlled for every photodiode 32. Such a photodiode 32 may convert back-scattered electrons scattered from the test sample into an electrical signal.

Therefore, the scanning electron microscope 100 according to the first exemplary embodiment of the present invention can be useful in minimizing dispersion of electrons of the electron beam passing through the shielding film 40 caused due to electron scattering by focusing the electron beam passing through the shielding film 40 on a top surface of the first back-scattered electron detector 30 disposed between the electron gun 20 and the shielding film 40 to pass an electron beam and configured to detect back-scattered electrons scattered from the test sample since the first back-scattered electron detector 30 is provided with the first planar coil 31a having a magnetic field formed thereon.

Hereinafter, a scanning electron microscope according to a second exemplary embodiment of the present invention will be described in further detail with reference to the drawings.

Figure 4:
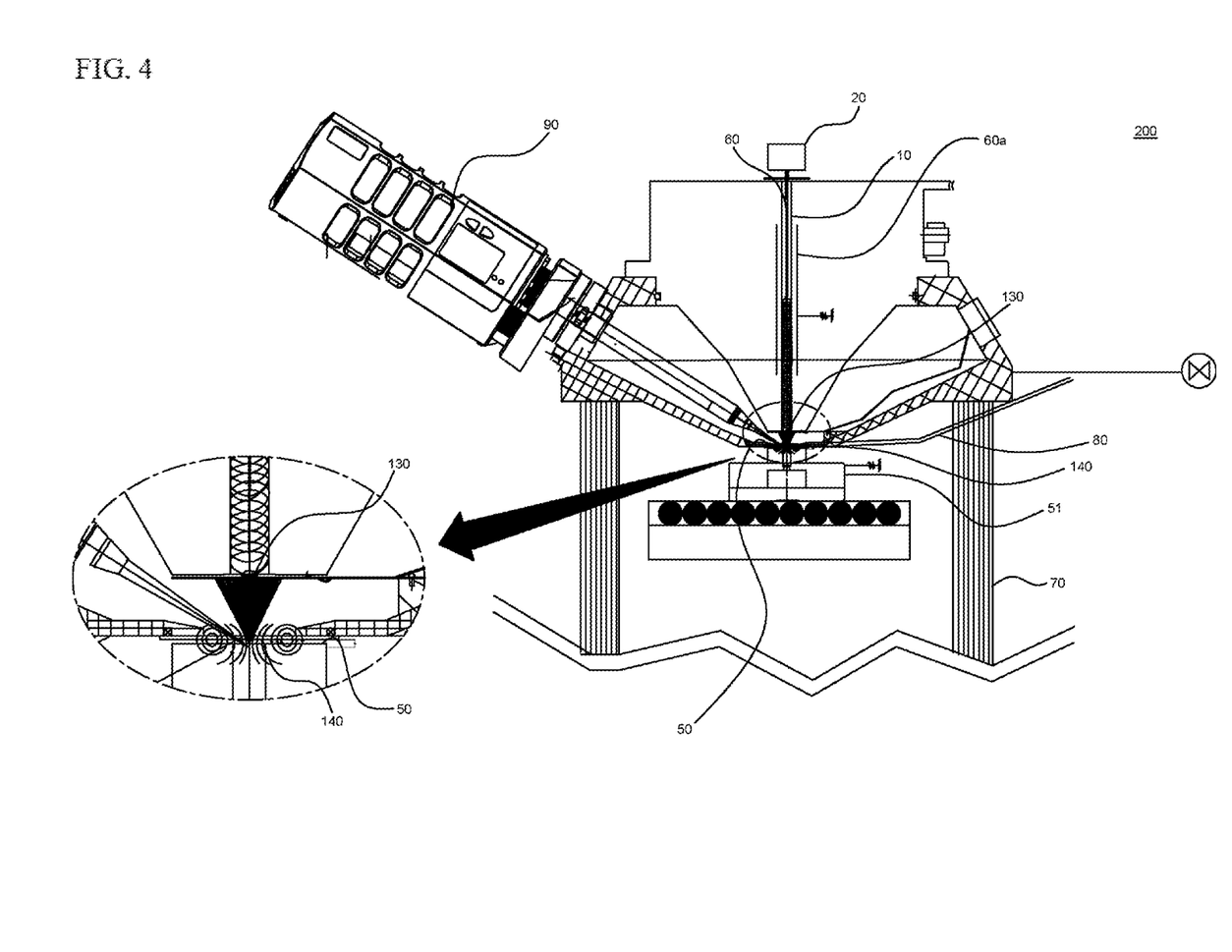
FIG. 4 is a schematic diagram illustrating a scanning electron microscope according to a second exemplary embodiment of the present invention.
Figure 5:
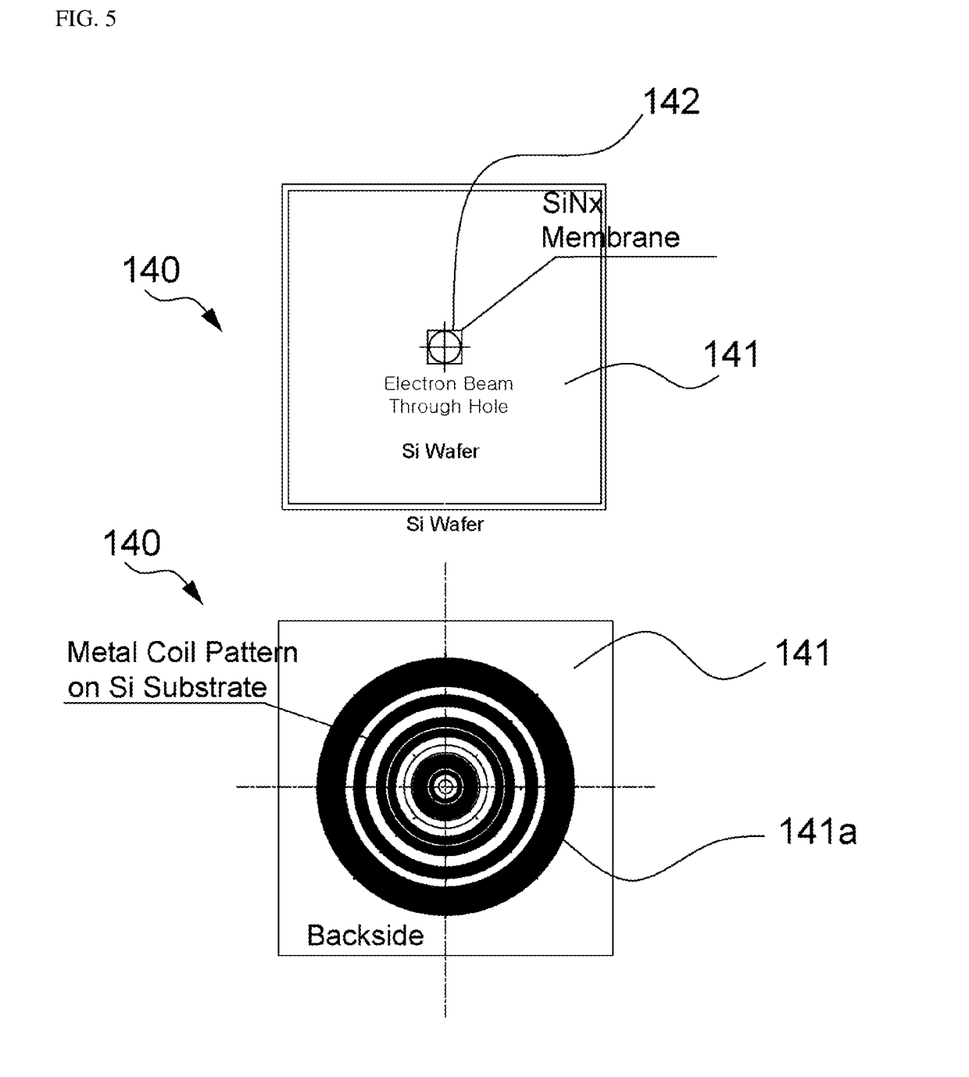
FIG. 5 is a diagram illustrating top and bottom surfaces of a shielding film in the scanning electron microscope according to the second exemplary embodiment of the present invention.
Figure 6:
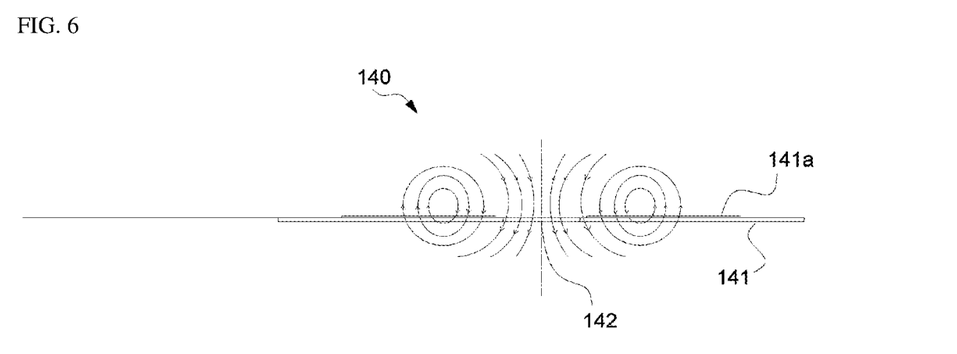
FIG. 6 is a cross-sectional view of the shielding film in the scanning electron microscope according to the second exemplary embodiment of the present invention.

FIG. 4 is a schematic diagram illustrating a scanning electron microscope according to a second exemplary embodiment of the present invention, FIG. 5 is a diagram illustrating top and bottom surfaces of a shielding film in the scanning electron microscope according to the second exemplary embodiment of the present invention, and FIG. 6 is a cross-sectional view of the shielding film in the scanning electron microscope according to the second exemplary embodiment of the present invention.

Referring to FIGS. 4 to 6, a scanning electron microscope 200 according to a second exemplary embodiment of the present invention has substantially the same configuration as the scanning electron microscope 100 according to the first exemplary embodiment of the present invention except the configuration of the first back-scattered electron detector 30 and the shielding film 40. Thus, repeated description of the same configuration will be omitted for clarity, and like parts has like reference numerals in the same configuration.

The scanning electron microscope 200 according to the second exemplary embodiment of the present invention includes a column 10, an electron gun 20, a first back-scattered electron detector 130, a shielding film 140, and a test sample stage 50. In addition, the scanning electron microscope 200 according to the second exemplary embodiment of the present invention includes a second back-scattered electron detector 60, a chamber 70, a gas supply unit 80, and an X-ray spectrometer 90.

The first back-scattered electron detector 130 may be disposed between the electron gun 20 and the shielding film 140 to form a hole through which an electron beam passes, and detect back-scattered electrons scattered backward from a test sample.

Here, the shielding film 140 according to the second exemplary embodiment of the present invention may form a portion of a bottom surface of the column 10 so that an inner part of the column 10 is formed in a vacuum state, and may be provided with a second planar coil 141a having a magnetic field formed on a top surface thereof so as to focus the electron beam and pass the focused electron beam therethrough.

Such a shielding film 140 includes a cover plate 141 and an ultra-thin film 142.

The cover plate 141 may form a portion of the bottom surface of the column 10, and may be provided with the second planar coil 141a having a magnetic field formed on a top surface thereof.

Here, an electric current is applied to the second planar coil 141a, and the second planar coil 141a to which the electric current is applied forms a magnetic field. In this case, the magnetic field formed from the second planar coil 141a may be formed in the same direction as a shooting direction of the electron beam.

Accordingly, the electron beam shot from the electron gun 20 may be focused by the magnetic field formed by the second planar coil 141a and transferred to a surface of the test sample while passing through the ultra-thin film 142 provided in the cover plate 141.

Also, the magnetic field formed from the second planar coil 141a may be formed in an opposite direction to the shooting direction of the electron beam.

In this case, a quantity of energy incident on the test sample may be minimized by interfering with a highly accelerated energy of electron beam shot from the electron gun 20, thereby minimizing damage of a surface of the test sample caused when a highly accelerated voltage of electron beam is applied to the surface of the test sample.

As such, the direction of the magnetic field may be determined according to a winding direction of the second planar coil 141a.

Such a second planar coil 141a may be formed in the form of a coil pattern around the ultra-thin film 142 on a top surface of the cover plate 141. That is, the second planar coil 141a may generate a magnetic field to focus the electron beam by depositing a planar coil on the top surface of the cover plate 141 using a semiconductor pattern process and applying a minute electric current to the planar coil.

Also, the second planar coil 141a may generate a magnetic field to focus the electron beam by mounting an ultra-thin-film PCB having a separate coil pattern formed thereon onto the top surface of the cover plate 141 and applying a minute electric current to the PCB.

The ultra-thin film 142 may be provided at a position through which an electron beam passes in the cover plate 141. Such an ultra-thin film 142 may be formed by etching the cover plate 141 formed of a silicon material.

Also, a hole through which an electron beam passes may be formed in the cover plate 141, and the ultra-thin film 142 may be attached to a bottom surface of the cover plate 141 having the hole formed therein. In the case, the ultra-thin film 142 may be a graphene thin film. Such an ultra-thin film 142 may be attached to the cover plate 141 using a double-sided adhesive tape and instant glue having high viscosity.

Therefore, the ultra-thin film 142 may serve to maintain a vacuum state of the column 10 and pass an electron beam shot by the electron gun 20 and transferred through the first back-scattered electron detector 130.

Accordingly, the scanning electron microscope 200 according to the second exemplary embodiment of the present invention can be useful in minimizing dispersion of electrons of the electron beam caused due to electron scattering by focusing an electron beam shot onto the test sample through the ultra-thin film 142 since the second planar coil 141a having a magnetic field formed thereon is provided on a top surface of the shielding film 140.

Figure 7:
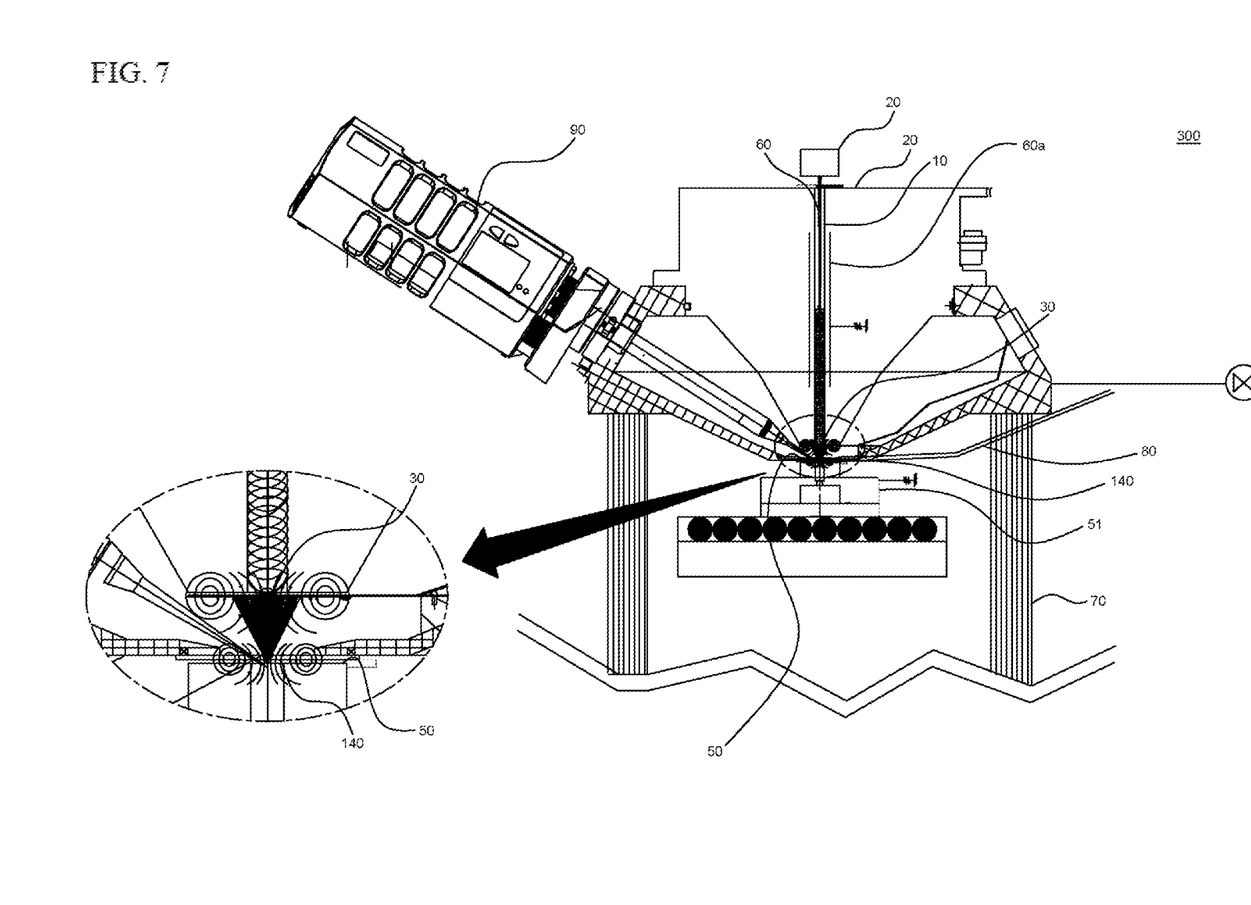
FIG. 7 is a schematic diagram illustrating a scanning electron microscope according to a third exemplary embodiment of the present invention.

FIG. 7 is a schematic diagram illustrating a scanning electron microscope according to a third exemplary embodiment of the present invention.

Referring to FIGS. 1 to 7, a scanning electron microscope 300 according to a third exemplary embodiment of the present invention has substantially the same configuration as the scanning electron microscopes 100 and 200 according to the first and second exemplary embodiments of the present invention except the configuration of the first back-scattered electron detectors 30 and 130 and the shielding films 40 and 140. Thus, repeated description of the same configuration will be omitted for clarity, and like parts has like reference numerals in the same configuration.

Referring to FIG. 7, the first back-scattered electron detector 30 according to the first exemplary embodiment and the shielding film 140 according to the second exemplary embodiment may be applied to the scanning electron microscope 300 according to the third exemplary embodiment of the present invention.

That is, the scanning electron microscope 300 according to the third exemplary embodiment of the present invention may be configured to include the first back-scattered electron detector 30 having the first planar coil 31a formed therein, and the shielding film 40 having the second planar coil 141a formed therein.

Therefore, the scanning electron microscope 300 according to the third exemplary embodiment of the present invention can be useful in minimizing dispersion of electrons of the electron beam passing through the shielding film 140 caused due to electron scattering by primarily focusing an electron beam passing through the shielding film on a top surface of the first back-scattered electron detector 30 disposed between the electron gun 20 and the shielding film 140 to pass an electron beam and configured to detect back-scattered electrons scattered from the test sample since the first back-scattered electron detector 30 is provided with the first planar coil 31a having a magnetic field formed thereon, and secondarily focusing the electron beam through the second planar coil 141a formed on a top surface of the shielding film 140.

In summary, as the dispersion of the electron beam passing thorough the shielding film 40 or 140 is minimized, the scanning electron microscopes 100, 200 and 300 according to the first to third exemplary embodiments of the present invention can be useful in reducing unnecessary processes, for example, securing a distance between the shielding film 40 or 140 and the test sample to adjust an initial focus under a separate optical microscope, loading the test sample, etc.

In this specification, exemplary embodiments of the present invention have been classified into the first, second and third exemplary embodiments and described for conciseness. However, respective steps or functions of an exemplary embodiment may be combined with those of another exemplary embodiment to implement still another exemplary embodiment of the present invention.

BRIEF DESCRIPTION OF MAIN PARTS IN THE DRAWINGS

| | |
|---|---|
| 10: column | 20: electron gun |
| 30, 130: first back-scattered electron detector | 31: first wafer |
| 31a: first planar coil | 32: photodiode |
| 40, 140: shielding film | 50: test sample stage |
| 51: holder | 60: second back-scattered electron detector |
| 70: chamber | 80: gas supply unit |
| 90: X-ray spectrometer | 100, 200, 300: scanning electron microscope |
| 141: cover plate | 141a: second planar coil |
| 142: ultra-thin film | |

What is claimed is:
1. A scanning electron microscope comprising;
a column in which a vacuum state is formed;
an electron gun disposed above the column and configured to shoot an electron beam in a downward direction under a vacuum;

a shielding film forming a portion of a bottom surface of the column so that an inner part of the column is formed in a vacuum state, and configured to pass the electron beam therethrough;

a test sample stage disposed under the shielding film to dispose a test sample so that the test sample is irradiated with the electron beam passed through the shielding film from the electron gun; and a first back-scattered electron detector disposed between the electron gun and the shielding film to form a hole through which the electron beam passes, provided with a first planar coil having a magnetic field formed on a top surface thereof so as to focus the electron beam and transfer the focused electron beam to the shielding film, and configured to detect back-scattered electrons scattered backward from the test sample, wherein the first back-scattered electron detector comprises:

a first wafer having a top surface having the first planar coil formed thereon and disposed between the electron gun and the shielding film to form the hole through which the electron beam passes; and a photodiode formed on a bottom surface of the first wafer to detect the back-scattered electrons.

2. The scanning electron microscope of claim 1, wherein the first planar coil has a coil pattern formed around the hole on the top surface of the first wafer.

3. The scanning electron microscope of claim 1, wherein the first planar coil has a coil pattern formed around the hole by forming a hole on a central region of a separate printed circuit board (PCB) so that an electron beam passes through the hole, forming a coil pattern around the hole, and attaching the PCB, on which the coil pattern is formed, to the top surface of the first wafer.

4. The scanning electron microscope of claim 1, wherein the first planar coil is formed by attaching a separate coil to the top surface of the first wafer around the hole.

5. The scanning electron microscope of claim 1, wherein the shielding film comprises:

a cover plate forming a portion of the bottom surface of the column; and an ultra-thin film formed on the cover plate to form an inner part of the column in a vacuum state, wherein the electron beam passes through the ultra-thin film.

6. The scanning electron microscope of claim 5, wherein the ultra-thin film comprises a silicon thin film formed by etching the cover plate.

7. The scanning electron microscope of claim 5, wherein the cover plate has a hole formed therein to pass the electron beam therethrough, and the ultra-thin film comprises a graphene thin film attached to a bottom surface of the cover plate so that the graphene thin film comprises the hole.

8. The scanning electron microscope of claim 5, wherein the shielding film further comprises a second planar coil provided on a top surface of the s cover plate and configured to form a magnetic field to secondarily focus the electron beam primarily focused through the first planar coil and transfer the secondarily focused electron beam to the test sample.

9. The scanning electron microscope of claim 8, wherein the magnetic fields of the first and second planar coils are formed in the same direction as that of the electron beam, or formed in an opposite direction to that of the electron beam.

10. The scanning electron microscope of claim 1, further comprising a second back-scattered electron detector disposed above the column and configured to detect back-scattered electrons flowing inside the column through the hole of the first back-scattered electron detector.

11. A scanning electron microscope comprising:

a column in which a vacuum state is formed;

an electron gun disposed above the column and configured to shoot an electron beam in a downward direction under a vacuum;

a shielding film which forms a portion of a bottom surface of the column such that an inner part of the column is formed in a vacuum state and the electron beam passes therethrough;

a test sample stage disposed under the shielding film to dispose a test sample so that the test sample is irradiated with the electron beam passed through the shielding film from the electron gun; and a first back-scattered electron detector which is disposed between the electron gun and the shielding film to form a hole through which the electron beam passes, has a first planar coil which has a magnetic field formed on a top surface thereof to focus the electron beam and transfer the focused electron beam to the shielding film, and is configured to detect back-scattered electrons scattered backward from the test sample, wherein the shielding film comprises:

a wafer which forms a portion of the bottom surface of the column;

an ultra-thin film which is formed on the wafer such that the inner part of the column is formed in a vacuum state and the electron beam passes therethrough; and a second planar coil which is provided on the upper surface of the wafer and forms a magnetic field to focus the electron beam primarily focused by the first planar coil again and transfer the electron beam focused twice to the test sample.

* * * * *